United States Patent
Kumar et al.

(10) Patent No.: US 6,297,100 B1
(45) Date of Patent: Oct. 2, 2001

(54) METHOD OF MANUFACTURING SILICON CARBIDE SEMICONDUCTOR DEVICE USING ACTIVE AND INACTIVE ION SPECIES

(75) Inventors: Rajesh Kumar, Kariya; Masami Naito, Inazawa; Hiroki Nakamura, Kariya; Yuichi Takeuchi, Obu, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/408,185

(22) Filed: Sep. 29, 1999

(30) Foreign Application Priority Data

Sep. 30, 1998 (JP) .................................. 10-278227
Jun. 29, 1999 (JP) .................................. 11-184264
Sep. 17, 1999 (JP) .................................. 11-264329

(51) Int. Cl.[7] .................................. H01L 21/336
(52) U.S. Cl. .................. 438/268; 438/105; 438/520; 438/931
(58) Field of Search .................... 438/105, 137, 438/138, 268, 520, 528, 931

(56) References Cited

U.S. PATENT DOCUMENTS

| | | | |
|---|---|---|---|
| 3,982,262 | * 9/1976 | Karatsjuba et al. | 438/931 |
| 5,318,915 | * 6/1994 | Baliga et al. | 438/520 |
| 5,322,802 | * 6/1994 | Baliga et al. | 438/931 |
| 5,323,040 | 6/1994 | Baliga | 257/332 |
| 5,459,107 | 10/1995 | Palmour | 438/767 |
| 5,543,637 | 8/1996 | Baliga | 257/77 |
| 5,681,762 | 10/1997 | Baliga | 438/105 |
| 5,710,059 | 1/1998 | Rottner | 438/105 |
| 5,776,837 | 7/1998 | Palmour | 438/931 |
| 6,096,627 | * 8/2000 | Harris et al. | 438/520 |

FOREIGN PATENT DOCUMENTS 5-259443 10/1993 (JP) .
9-63968 3/1997 (JP) .

OTHER PUBLICATIONS

High–Voltage Double–Implanted Power MOSFET's in 6H–SiC, Jayarama N. Shenoy et al., IEEE Electron Device Letters, vol. 18, No. 3, Mar. 1997, pp. 93–95.

* cited by examiner

Primary Examiner—Chandra Chaudhari
(74) Attorney, Agent, or Firm—Pillsbury Winthrop LLP

(57) ABSTRACT

In a vertical MOSFET, an inactive ion species is ion-implanted into a J-FET portion, a surface channel layer, and/or a base region. The inactive ion species fill intrinsic carbon vacancies or interact with interstitial Si atoms, which are possible origin or responsible for B-diffusion from the base region. Accordingly, the B-diffusion caused by the intrinsic carbon vacancies when the base region is formed is suppressed. The width of the J-FET portion is prevented from being decreased, thereby preventing an increase in resistance of the J-FET portion. Also, the conductive type of the surface channel layer is prevented from being inverted by diffused impurities.

32 Claims, 12 Drawing Sheets

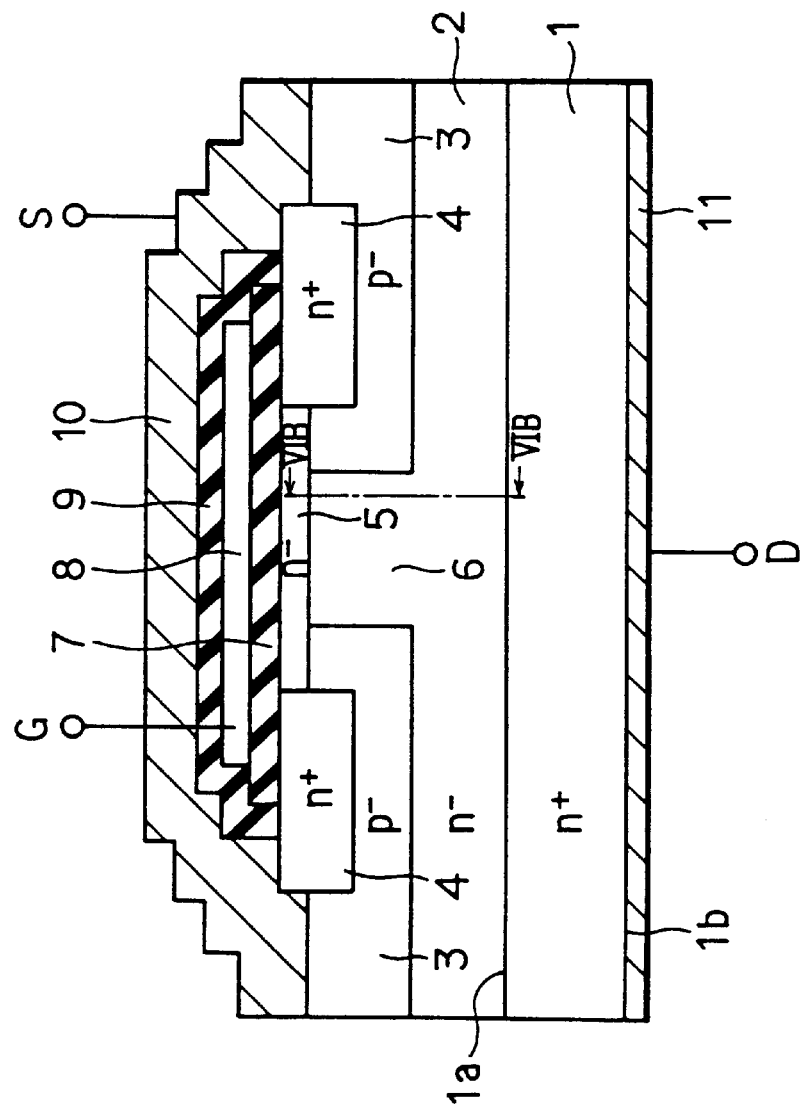

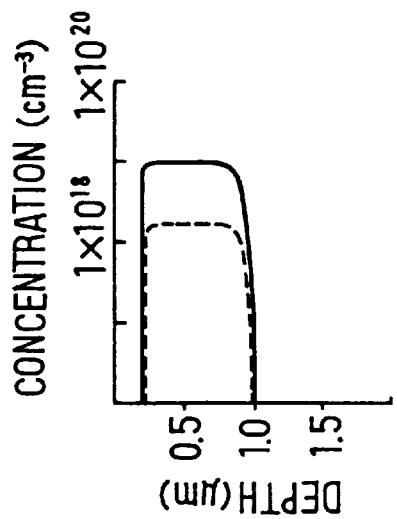
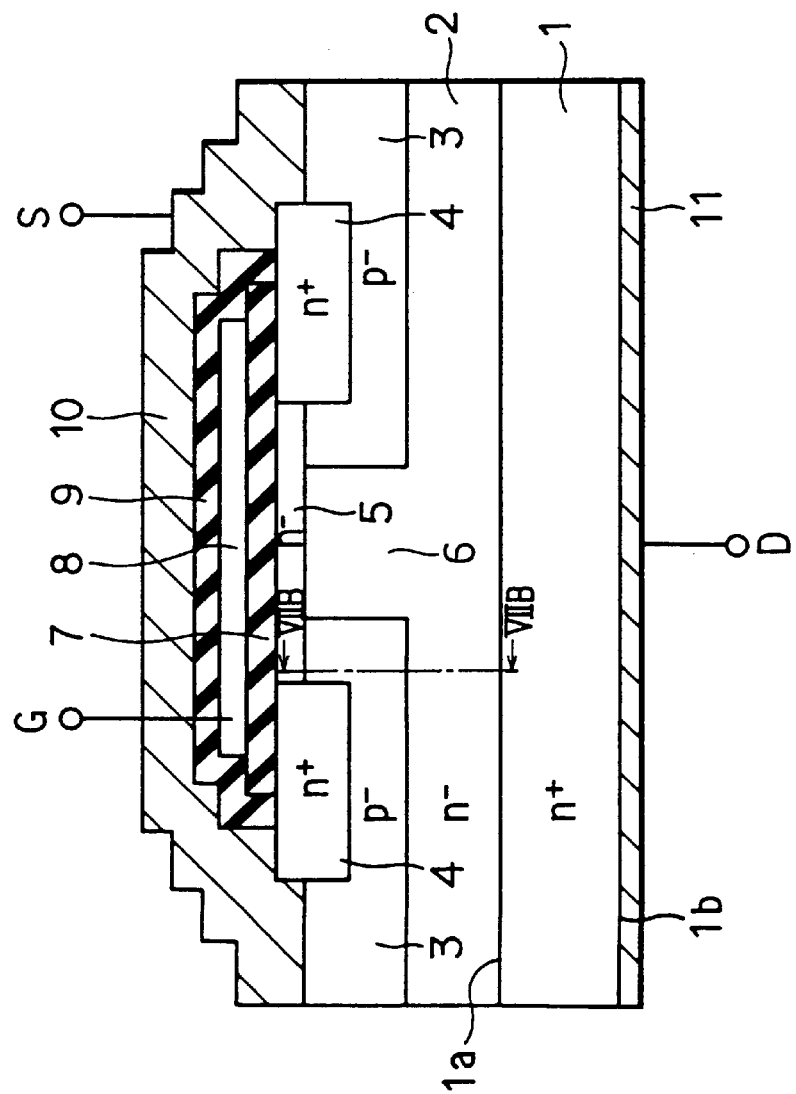
FIG. 7B
FIG. 7A

METHOD OF MANUFACTURING SILICON CARBIDE SEMICONDUCTOR DEVICE USING ACTIVE AND INACTIVE ION SPECIES

CROSS REFERENCE TO RELATED APPLICATIONS

This application is based upon and claims the benefit of Japanese Patent Applications No. 10-278227 filed on Sep. 30, 1998 and No. 11-184264 filed on Jun. 29, 1999, No. 11-264329 filed on Sep. 17, 1999, the contents of which are incorporated herein by reference.

BACKGROUND OF THE INVENTION

1. Field of the Invention

This invention relates to a silicon carbide (SiC) semiconductor device, particularly to an insulation gate type field effect transistor such as a vertical power MOSFET for high power applications, and to a method of manufacturing the same.

2. Description of the Related Art

The applicant of the present invention proposes a planar type MOSFET capable of improving channel mobility to reduce an ON resistance in JP-A-10-308510 published on Nov. 17, 1998.

Referring to FIG. 12, the planar type MOSFET has an n+ type semiconductor substrate 1 made of SiC and having a main surface 1a at an upper side of the figure and a back surface 1b at a lower side of the figure. An n⁻ type epitaxial layer (herebelow, referred to as an epi-layer) 2 made of SiC and having a dopant concentration smaller than that of the substrate 1 is disposed on the main surface 1a of the substrate 1.

Several p type base regions 3 are provided in specific surface portions of the n⁻ type epi-layer 2 with a specific depth. The p type base regions 3 include boron (B) as a dopant with a dopant concentration of approximately $1 \times 10^{17}$ cm⁻³ or more. Several n+ source regions 4 are formed in specific surface portions of the p type base regions 3 with a depth shallower than that of the p type base regions 3. An n⁻ type SiC layer 5 extends in the surface portions of the p type base regions 3 to connect the n+ type source regions 4 and the n⁻ type epi-layer 2. The n⁻ type SiC layer 5 is epitaxially grown on the substrate 1 to have a 4H, 6H, 15R or 3C crystal structure. A channel is formed in then n⁻ type SiC layer 5 when the device is operated. Herebelow, the n⁻ type Sic layer 5 is referred to as a surface channel layer.

The surface channel layer 5 includes nitrogen (N) as a dopant with a dopant concentration in a range of, for example, $1 \times 10^{15}$ cm⁻³ to $1 \times 10^{17}$ cm⁻³, which is lower than those of the n⁻ type epi-layer 2 and the p type base regions 3, thereby realizing a low ON resistance. A part of the n⁻ type epi-layer 2 extending between the p type base regions 3 is a so-called J-FET portion 6.

A gate oxide film 7 is formed on the surface channel layer 5 and on the n+ type source regions 4 by thermal oxidation, and a gate electrode 8 is formed on the gate oxide film 7. The gate electrode 8 is covered with an insulation film 9 made of LTO (Low Temperature Oxide). A source electrode 10 is formed on the insulation film 9 in contact with the n+ type source regions 4 and the p type base regions 3. A drain electrode 11 is formed on the back surface 1b of the substrate 1.

This planar type MOSFET is operated in an accumulation mode at which a channel is induced without inverting the conductive type of the surface channel layer 5. In the accumulation mode, the surface (channel) mobility is less influenced by the electric field (gate) and surface effects (MOS interface) compared to the inversion mode due to a large depth of the channel (about 5–10 times). Therefore, channel mobility of the MOSFET is large, so that the ON resistance is reduced as compared to that of a MOSFET, which is operated in an inversion mode at which the conductive type of the surface channel layer is inverted. However, when B is used as a dopant for forming the p type base regions 3, B is diffused during heat treatment, such as during activation annealing as disclosed in U.S. Pat. No. 5,710,059. Diffused B can narrow the width of the J-FET portion, and undesirably invert the conductive type of the surface channel layer 5 contacting the p type base regions 3.

SUMMARY OF THE INVENTION

The present invention has been made in view of the above limitations. A first object of the present invention is to prevent a width of a J-FET portion extending between base regions from being narrowed by diffused impurities. A second object of the present invention is to prevent inversion of a surface channel layer conductive type by diffused impurities.

In the cases where the n⁻ type epi-layer 2 is epitaxially grown and where the p type base regions 3 are formed by ion implantation of B-impurity atoms, it is believed that carbon vacancies are responsible for the extended diffusion of B. The carbon vacancies are produced during the ion implantation process. Also a kick-out mechanism which explains B at a Si-lattice site and an interstitial Si complex (a highly mobile complex) is responsible for transient enhanced diffusion of B, thereby causing the limitations described above. The present invention overcomes these limitations based on the consideration described above.

Briefly, according to the present invention, a second conductive type base region is formed in a specific surface portion of a first conductive type semiconductor layer. The formation of the base region is performed by forming an impurity implantation layer by implanting ions of an inactive ion species into at least one of the specific surface portion for forming the base region and a J-FET portion, and second conductive type impurities of an active ion species into the specific surface portion; and activating the second conductive type impurities to form the base region contacting the J-FET portion. Preferably, the inactive ion species is C (carbon) and the active ion species is B (boron). Preferably, the implantation of the inactive ion species is carried out before the implantation of the second conductive type impurities.

Accordingly, carbon vacancies in the J-FET portion or in the specific surface portion for the base region can be eliminated by implanted ions of the inactive ion species to inhibit the diffusion of the second conductive type impurities. As a result, the width of the J-FET portion is not narrowed, and a length of a channel region produced on the J-FET portion is prevented from increasing.

Ions of the inactive ion species may be implanted into a surface channel layer formed on the base region. Accordingly, the second conductive type impurities are prevented from being diffused into the surface channel layer, thereby preventing inversion of the surface channel layer conductive type in an accumulation type semiconductor device.

The second conductive type impurities may be implanted into a part of the specific surface portion using a mask covering a surface between a source region and the J-FET portion. The implanted second conductive type impurities are diffused to exist entirely in the specific surface portion for forming the base region when the second conductive type impurities are activated. In this case, because the surface between the source region and the J-FET portion where the surface channel layer is to be formed does not undergo the ion implantation of the second conductive type impurities, the surface channel layer can be formed with high crystallinity.

In the silicon carbide semiconductor device according to the present invention, the inactive ion species is included in at least one of the base region and a portion contacting the base region. The portion contacting the base region is the J-FET portion, the surface channel layer, or the like. Accordingly, the diffusion of the second conductive type impurities is suppressed. When the inactive ion species is included in one of the base region and the J-FET portion, the width of the J-FET portion is prevented from being decreased. When the inactive ion species is included in the surface channel layer, the conductive type of the surface channel layer is prevented from being inverted.

BRIEF DESCRIPTION OF THE DRAWINGS

Other objects and features of the present invention will become more readily apparent from a better understanding of the preferred embodiments described below with reference to the following drawings, in which:

FIG. 6A is a cross-sectional view showing a planar type MOSFET in a third preferred embodiment;

FIG. 6B is a depth concentration profile of an ion species along line VIB—VIB in FIG. 6A;

FIG. 7A is a cross-sectional view showing a planar type MOSFET in a fourth preferred embodiment;

FIG. 7B is a depth concentration profile of an ion species along line VIIB—VIIB in FIG. 7A;

Figure 1B:
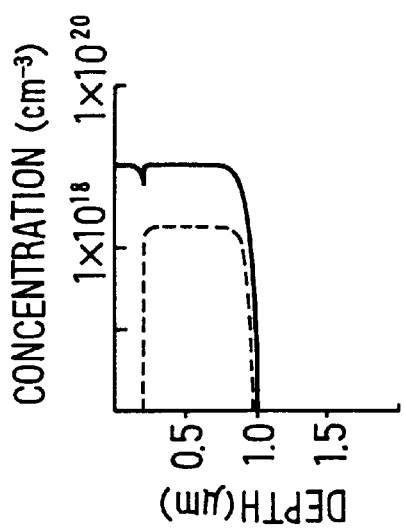
FIG. 1B is a depth concentration profile of an ion species along line IB—IB in FIG. 1A.

DETAILED DESCRIPTION OF THE PREFERRED EMBODIMENTS (First Embodiment)

The present invention is applied to formation of a normally-off n-channel planar type MOSFET (vertical power MOSFET) suitable for rectifiers of an inverter, an automotive alternator, and the like. As shown in FIG. 1A, the vertical power MOSFET in a first preferred embodiment has a structure similar to that of the conventional MOSFET shown in FIG. 12. In FIG. 1A, the same parts are indicated by the same reference numerals as those in FIG. 12. Only differences are explained below.

Figure 12:
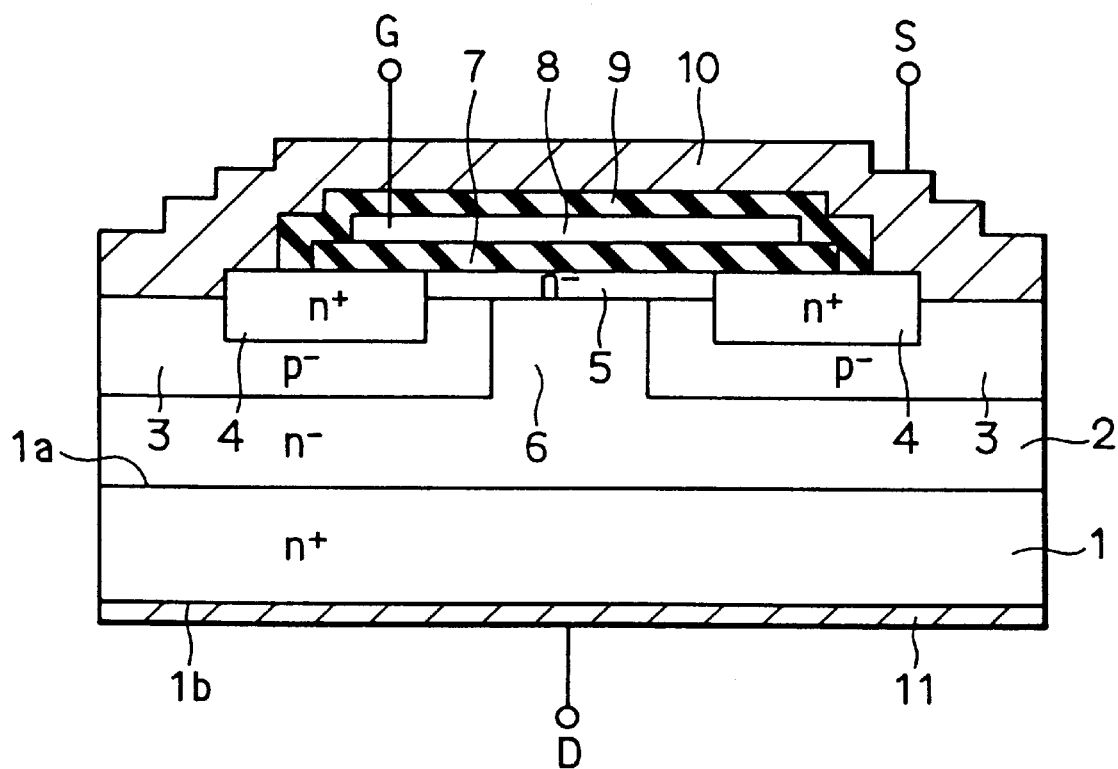
FIG. 12 is a cross-sectional view showing a planar type MOSFET proposed in the preceding application by the applicant.

In the MOSFET shown in FIG. 12, the surface channel layer 5 is formed by using N (nitrogen) alone as a dopant. The J-FET portion 6 is composed of only the n⁻ type epi-layer 2 provided between the p-type base regions 3. On the other hand, in the present embodiment, an inactive ion species, which does not act as an impurity, is implanted into the surface channel layer 5 and the J-FET portion 6.

Specifically, an ion species such as carbon (C), silicon (Si), helium (He), neon (Ne), or argon (Ar) is doped into the J-FET portion 6 and the surface channel layer 5. Accordingly, ions of the inactive ion species are disposed in vacancies, which are intrinsic defects of silicon carbide and have a density that depends on crystal growth conditions of silicon carbide. As a result, vacancies are eliminated from the J-FET portion 6 and the surface channel layer 5.

Figure 1A:
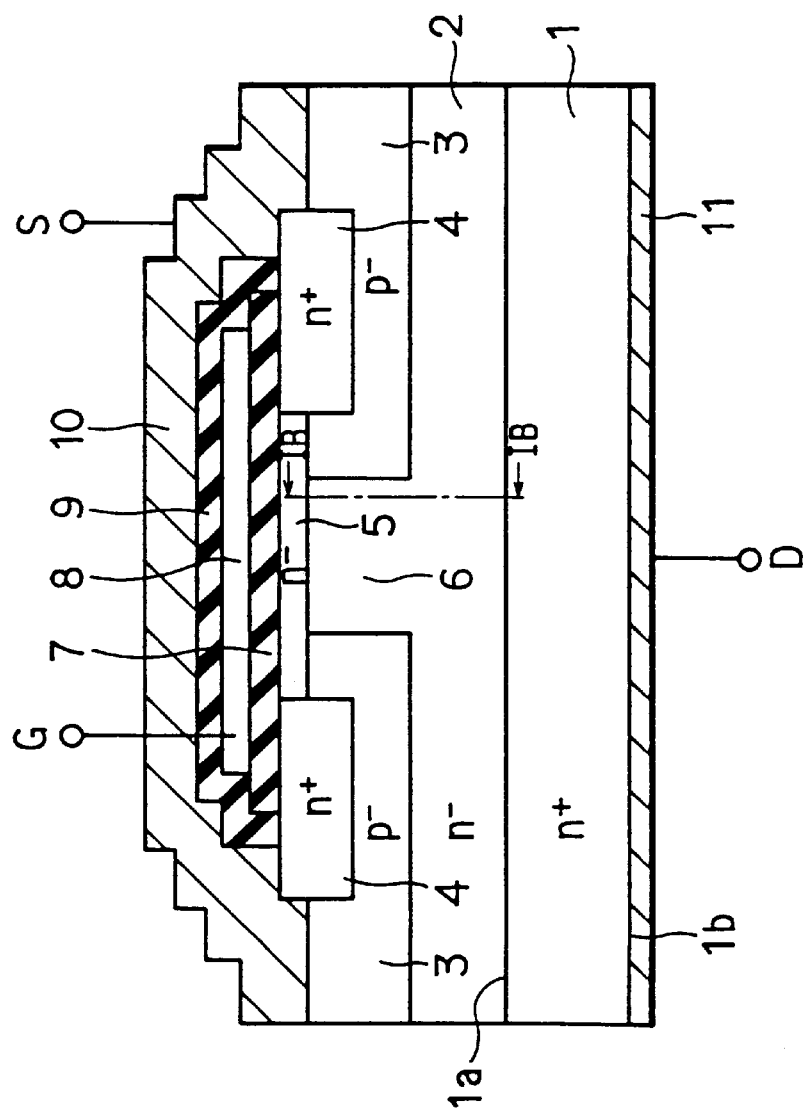
FIG. 1A is a cross-sectional view showing a planar type MOSFET in a first preferred embodiment.

FIG. 1B shows a depth concentration profile of the inactive ion species along line IB—IB in FIG. 1A with a solid line. A depth concentration profile of B in the p type base regions 3 is also shown in FIG. 1B with a broken line for comparison. As shown in the figure, the inactive ion species is implanted into the J-FET portion 6 and the surface channel layer 6 with a concentration higher than that of B.

Next, a manufacturing process of the MOSFET shown in FIG. 1A is explained with reference to FIGS. 2 to 4.

Figure 2A:
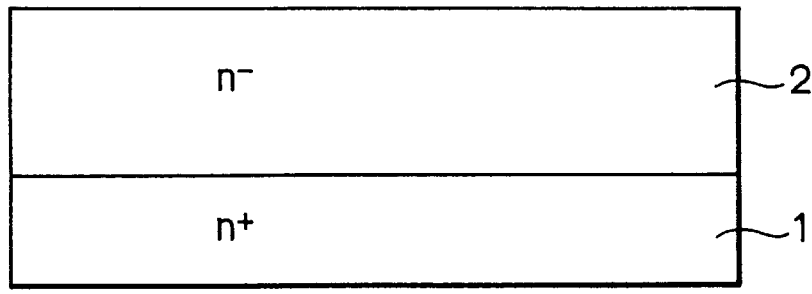
FIGS. 2A to 2C are cross-sectional views for explaining steps for manufacturing the planar type MOSFET shown in FIG. 1A.

First, at a step shown in FIG. 2A, an n type 4H, 6H, 15R, or 3C-SiC substrate is prepared as the n⁺ type semiconductor substrate 1. The substrate 1 is 400 μm in thickness, and has a (0001) Si-plane on the main surface 1a thereof and (000$\bar{1}$) c-plane on the back surface 1b thereof. The main surface 1a may be a (11$\bar{2}$0) a-plane. The n⁻ type epi-layer 2 is epitaxially grown on the main surface 1a of the substrate 1 with a thickness of approximately 5 μm–15 μm. In the present embodiment, the n⁻ type epi-layer 2 is composed of an n type 4H, 6H, 15R or 3C-SiC layer, a crystal structure of which is the same as that of the underlying substrate 1.

Figure 2B:
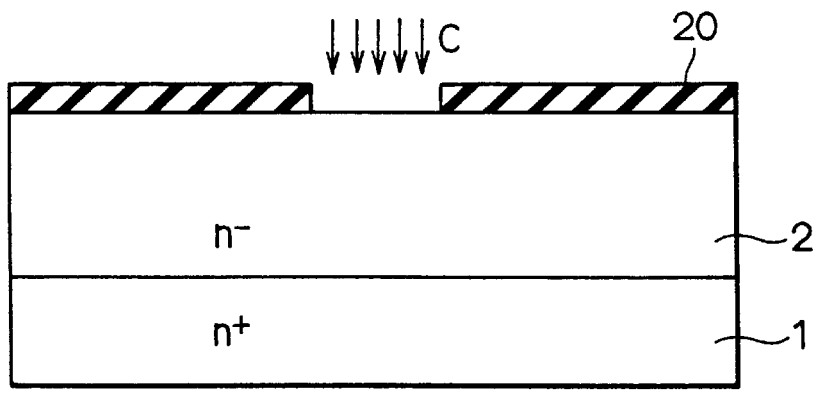

At a step shown in FIG. 2B, an LTO film 20 is disposed on the n⁻ type epi-layer 2 with an opening exposing a specific portion where the J-FET part 6 is to be formed. Then, the inactive ion species of, for example, C, Si, He, Ne, or Ar is implanted into the n⁻ type epi-layer 2 using the LTO film 20 as a mask at a temperature of in a range of approximately 500° C. to 1000° C. or more. When the inactive ion species is carbon, $C^{+12}$ constituting the n⁻ epi-layer 2 or $C^{+13}$ not constituting the n⁻ type epi-layer 2 may be used.

Figure 2C:
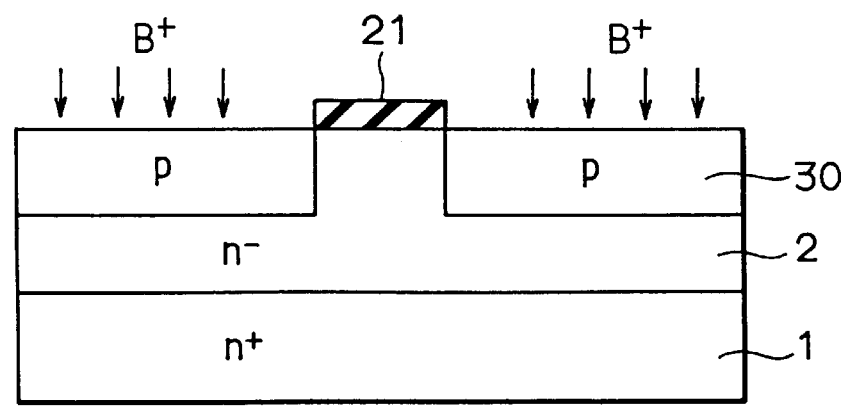

Next, at a step shown in FIG. 2C, after removing the LTO film 20, an LTO film 21 is disposed on the specific portion of the n⁻ type epi-layer 2. Ion implantation of B as an active ion species is then carried out using the LTO film 21 as a mask, at a temperature in a range of 500° C. to 1000° C. or more with a dose of less than $1 \times 10^{16}$ cm⁻². Accordingly, impurity implantation layers 30 into which B is implanted are formed with a specific depth from the surface of the n⁻ type epi-layer 2.

Comparing the ion implantation steps of the inactive ion species and B, the ion implantation energy of the inactive ion species is approximately equal to or larger than that of B for forming the impurity implantation layers 30. Accordingly, the inactive ion species is implanted to a depth approximately equal to or deeper than that of the impurity implantation layers 30. Further, the ion implantation steps are carried out so that the concentration of the inactive ion species is larger than that of B. For example, a concentration ratio of the inactive ion species relative to B ions is controlled to be approximately 1:10.

The implanted ions of the inactive ion species fill intrinsic carbon vacancies, or interact with the interstitial Si atoms to form SiC, thereby limiting the possibility of B diffusion. Carbon vacancies are eliminated by increasing the ion implantation amount of the inactive ion species. Therefore, when the inactive ion species is carbon, carbon vacancies can be eliminated by the inactive ion species with a relatively small concentration. When an ion species such as silicon is used in place of carbon, it is difficult for the inactive ion species to be disposed in carbon vacancies as compared to carbon. In such a case, it is preferable to increase the ion implantation amount as compared to the case where carbon ions are implanted.

Subsequently, activation annealing is carried out at 1500° C. to 1700° C. for 30 min, so that B in the impurity implantation layers 30 is activated to form the p type base regions 3. Consequently, the J-FET portion 6 is formed between the p type base regions 3. At that time, as described above, since carbon vacancies are eliminated by the inactive ion species implanted into the n⁻ type epi-layer 2 between the p type base regions 3, diffusion of B is suppressed. Therefore, the width of the J-FET portion 6 is hardly narrowed by the diffusion of B, thereby preventing an increased resistance of the J-FET portion 6 not to increase the ON resistance. Further, a length of a channel, which is formed on the J-FET portion 6, is prevented from being increased. Although the inactive ion species is implanted only into the J-FET portion 6 at the step shown in FIG. 2C, it may be implanted into the entire surface portion of the substrate 1 without using the LTO film 21.

Figure 3A:
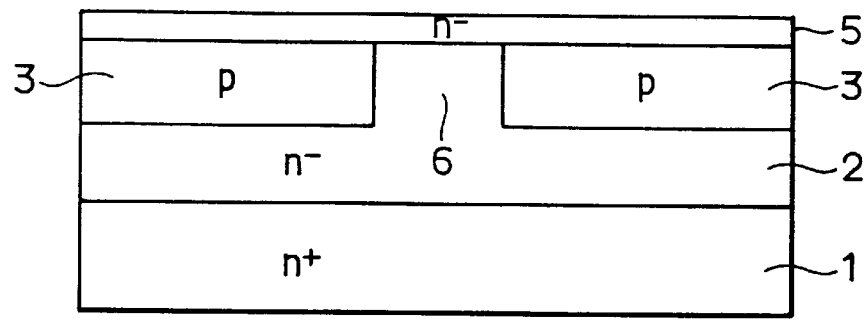
FIGS. 3A to 3C are cross-sectional views for explaining steps following the steps shown in FIGS. 2A to 2C, for manufacturing the planar type MOSFET.

At a step shown in FIG. 3A, after the LTO film 21 is removed, the surface channel layer 5 is epitaxially grown on the n⁻ type epi-layer 2 and on the p type base regions 3 to have an impurity concentration of approximately $1 \times 10^{15}$ cm$^{-3}$ to $1 \times 10^{17}$ cm$^{-3}$ and a thickness in a range of approximately 0.1 µm to 0.5 µm (0.3 µm in the present embodiment).

The surface channel layer 5 is formed to be completely made pinch-off due to extension of a depletion layer, which extends from the p type base regions 3 into the surface channel layer 5, and extension of a depletion layer, which extends from the gate oxide film 7 into the surface channel layer 5 when no voltage is applied to the gate electrode 8. Accordingly, the vertical power MOSFET is a normally-off type MOSFET.

The extension amount of the depletion layer extending from the p type base regions 3 is determined by the built-in voltage at the PN junction between the surface channel layer 5 and the p type base regions 3. The extension amount of the depletion layer extending from the gate oxide film 7 is determined by the electric charge of the gate oxide film 7 and the difference in work function between the gate electrode (metal) 8 and the surface channel layer (semiconductor) 5. The thickness of the surface channel layer 5 is determined based on these parameters.

In this normally-off type vertical power MOSFET, when failures occur to prevent the voltage from being applied to the gate electrode 8, no current flows therein. Therefore, the normally-off type MOSFET has a safety feature that prevents abnormal operation unlike a normally-on type MOSFET.

Referring again to FIG. 1A, the p type base regions 3 contact the source electrode 10 to be grounded. Therefore, the surface channel layer 5 can be brought into pinch-off by utilizing the built-in voltage at the PN junction between the surface channel layer 5 and the p type base regions 3. As opposed to this, when the p type base regions 3 are in a floating state without being grounded, the depletion layer cannot be expanded from the p type base regions 3 by utilizing the built-in voltage. Accordingly, the structure in which the p type base regions 3 and the source electrode 10 contact each other is effective to make the surface channel layer 5 pinch-off. The built-in voltage is increased by increasing the impurity concentration of the p type base regions 3.

In the present embodiment, because the vertical power MOSFET is made of SiC, it can be manufactured with high accuracy. If the MOSFET is made of Si, it is difficult to control thermal diffusion amounts of impurities when the p type base regions 3, the surface channel layer 5, and the like are formed. This makes it difficult to form the normally-off type MOSFET made of Si and having the same structure as that in the present invention.

Also, the thickness of the surface channel layer 5 must satisfy the conditions described above to make the vertical power MOSFET a normally-off type. However, when the MOSFET is made of Si, the built-in voltage is low. Because of this, it is necessary to decrease the thickness of the surface channel layer 5 or to decrease the impurity concentration of the surface channel layer 5. This also makes the manufacture of the Si MOSFET more difficult, as the diffusion amounts of impurities must be controlled. As opposed to this, when the MOSFET is made of SiC, the built-in voltage is approximately three times larger than that of the Si MOSFET, so that the thickness and the impurity concentration of the surface channel layer 5 can be increased. Therefore, the normally-off accumulation type MOSFET can be easily manufactured from SiC.

Figure 3B:
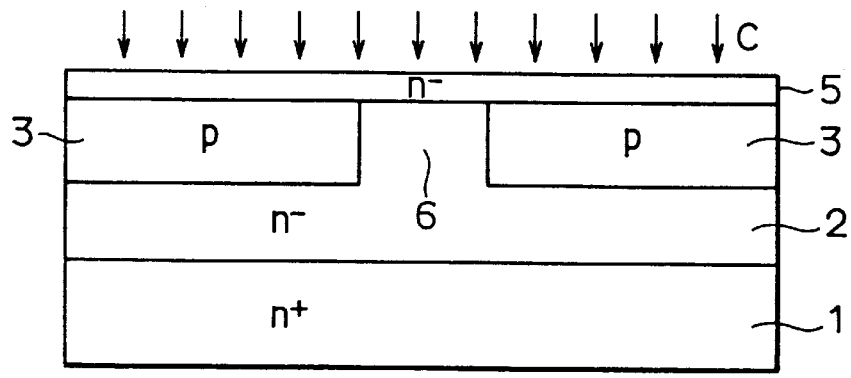

Next, at a step shown in FIG. 3B, the inactive ion species such as C, Si, He, Ne, or Ar is implanted into the surface channel layer 5 in a range of approximately 500° C. to 1000° C. or more (500° C. in the present embodiment) similarly to the step shown in FIG. 2B. This ion implantation is carried out so that the inactive ion species is implanted into the bottom portion of the surface channel layer 5 and so that the concentration of the inactive ion species is larger than that of the concentration of B ions for forming the p type base regions 3. For example, the concentration ratio of the inactive ion species relative to B ions is controlled to be 1:10. The thus implanted ion species fills intrinsic carbon vacancies, which are produced during the crystal growth of silicon carbide. Accordingly, carbon vacancies, which are more likely to be responsible for the diffusion of B, are eliminated from the surface channel layer 5.

Figure 3C:
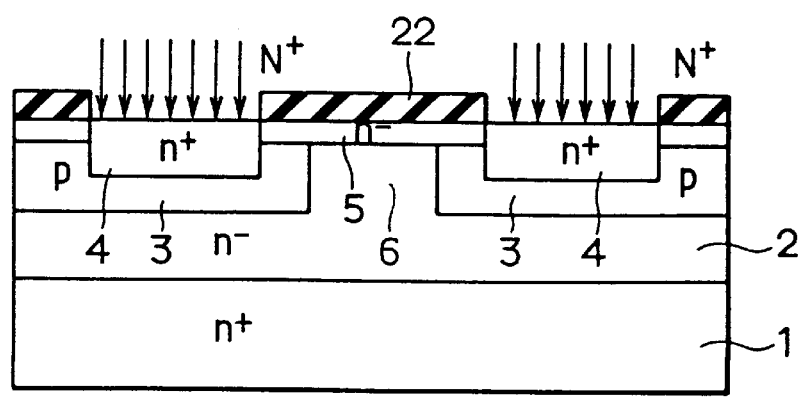

At a step shown in FIG. 3C, an LTO film 22 is disposed at specific surface regions of the surface channel layer 5, and ion implantation of n type impurities such as nitrogen (N) or phosphorus (P) is carried out using the LTO film 22 as a mask. After that, heat treatment is carried out to activate the implanted n type impurity ions to thereby form the n⁺ type source regions 4. As ion implantation conditions, a temperature is in a range of 500° C. to 1000° C. or more (approximately 700° C. in the present embodiment) and a dose is approximately $1 \times 10^{15}$ cm$^{-2}$.

Because carbon vacancies are eliminated not only from the J-FET portion 6 contacting the p type base regions 3 but also from the surface channel layer 5 as described above, the heat treatment, which is performed after the surface channel layer 5 is formed for, for example, forming the n$^+$ type source regions 4, does not cause the diffusion of B from the P type base regions 3 into the J-FET portion 6 and the surface channel layer 5.

Figure 4A:
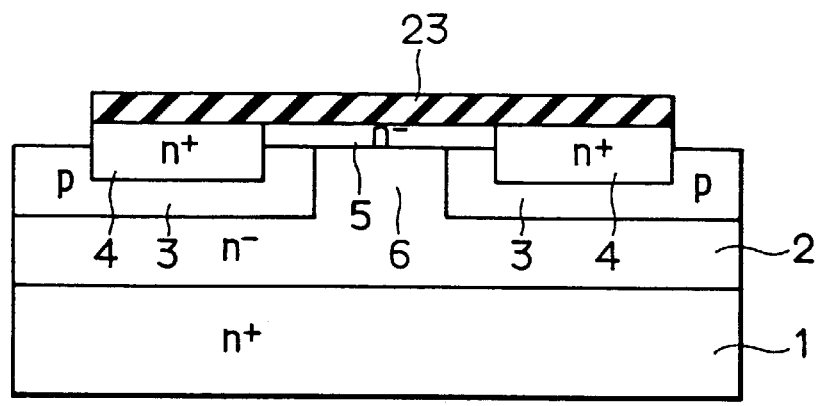
FIGS. 4A to 4C are cross-sectional views for explaining steps following the steps shown in FIGS. 3A to 3C, for manufacturing the planar type MOSFET.
Figure 4B:
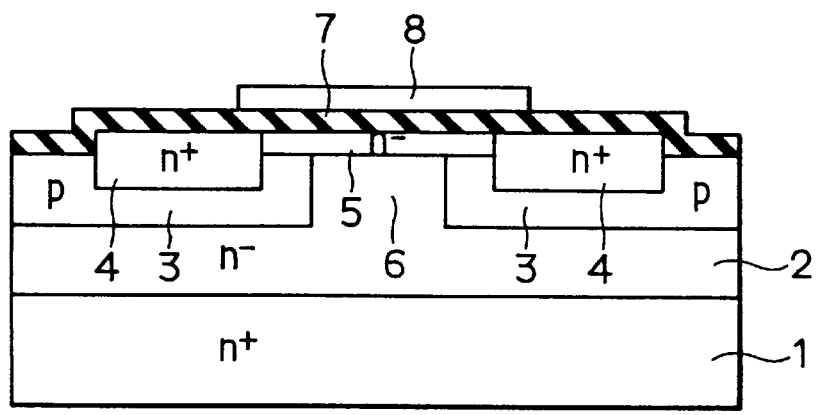

After the LTO film 22 is removed, at a step shown in FIG. 4A, an LTO film 23 is disposed at a specific surface region of the surface channel layer 5 by a photo-resist method. The surface channel layer 5 extending on the p type base regions 3 is partially removed by RIE using the LTO film 23 as a mask. After that, the LTO film 23 is removed. At a step shown in FIG. 4B, the gate oxide film 7 is formed on the substrate 1 by wet-oxidation (involving a known pyrogenic method using $H_2+O_2$) at an ambient temperature of 1080° C. Further, the gate electrode 8 made of polysilicon is deposited on the gate oxide film 7 by LPCVD at a deposition temperature of 600° C.

Figure 4C:
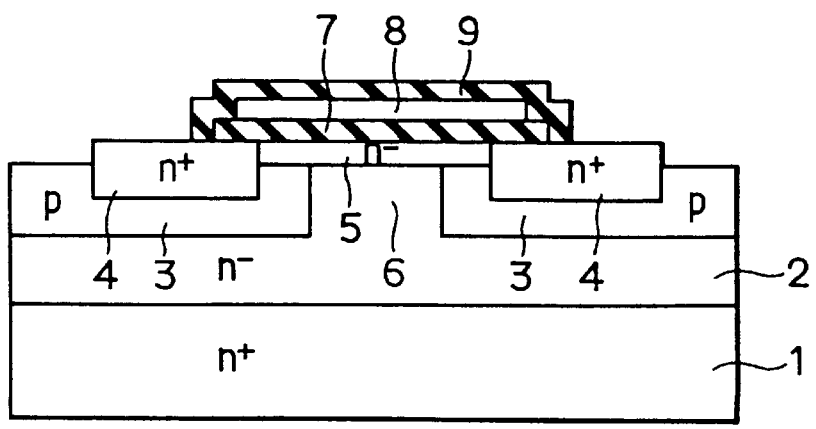

Subsequently, at a step shown in FIG. 4C, an unnecessary portion of the gate oxide film 7 is removed, and the remaining gate oxide film 7 is covered with the LTO insulation film 9. The deposition temperature for forming the insulation film 9 is approximately 425° C. After the deposition, annealing is carried out at approximately 1000° C. The source electrode 10 and the drain electrode 11 are then formed by metal-sputtering at room temperature, and annealing is carried out at approximately 1000° C. again, thereby completing the vertical power MOSFET shown in FIG. 1A.

Next, operation of the MOSFET manufactured as described above will be explained. The MOSFET in the present embodiment is a normally off type and works in an accumulation mode. When no voltage is applied to the gate electrode 8, carriers in the surface channel layer 5 are entirely depleted by a difference in electrostatic potential between the p type base regions 3 and the surface channel layer 5, and a potential produced by a difference in work function between the surface channel layer 5 and the gate electrode 8. The application of the voltage to the gate electrode 8 varies the potential difference produced by the sum of the difference in work function between the surface channel layer 5 and the gate electrode 8 and the externally applied voltage. Accordingly, the channel state is controlled.

That is, when the work functions of the gate electrode 8, the p type base regions 3, and the surface channel layer 5 are represented as first, second, and third work functions, respectively, the first to third work functions, and the impurity concentration and the thickness of the surface channel layer 5 are determined so that n type carriers in the surface channel layer 5 can be depleted by utilizing the differences among the first to third work functions.

In the OFF state, the depletion region is formed in the surface channel layer 5 by an electric field produced between the p type base regions 3 and the gate electrode 8. In this state, a positive bias is applied to the gate electrode 8. Accordingly, a channel region is formed at the interface between the gate insulation (SiO$_2$) film 7 and the surface channel layer 5 to extend from the n$^+$ type source regions 4 toward the n$^-$ type epi-layer 2, thereby switching to the ON state.

In the ON state, electrons flow from the n$^+$ type source regions 4 to the n$^-$type epi-layer (drift region) 2 through the surface channel layer 5, and then flow perpendicularly to the n$^+$ type semiconductor substrate 1 (n$^+$ type drain electrode) from the n$^-$ type epi-layer 2. Thus, the accumulation type channel is induced in the surface channel layer 5 by the positive voltage applied to the gate electrode 8. As a result, carriers flow between the source electrode 10 and the drain electrode 11.

(Second Embodiment)

In the first embodiment, the inactive ion species is implanted into the J-FET portion 6 and the surface channel layer 5. In a second preferred embodiment, the inactive ion species is implanted only into the J-FET portion 6. The other features are the same as those in the first embodiment, and are not be reiterated.

Figure 5B:
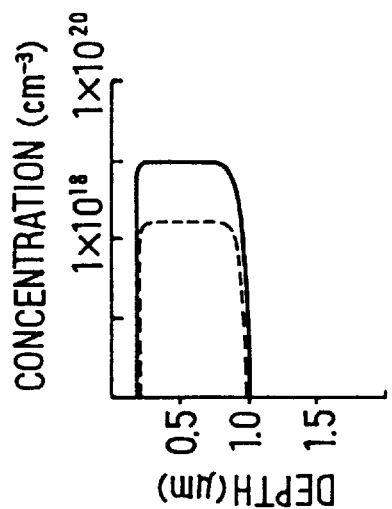
FIG. 5B is a depth concentration profile of an ion species along line VB—VB in FIG. 5A.
Figure 5A:
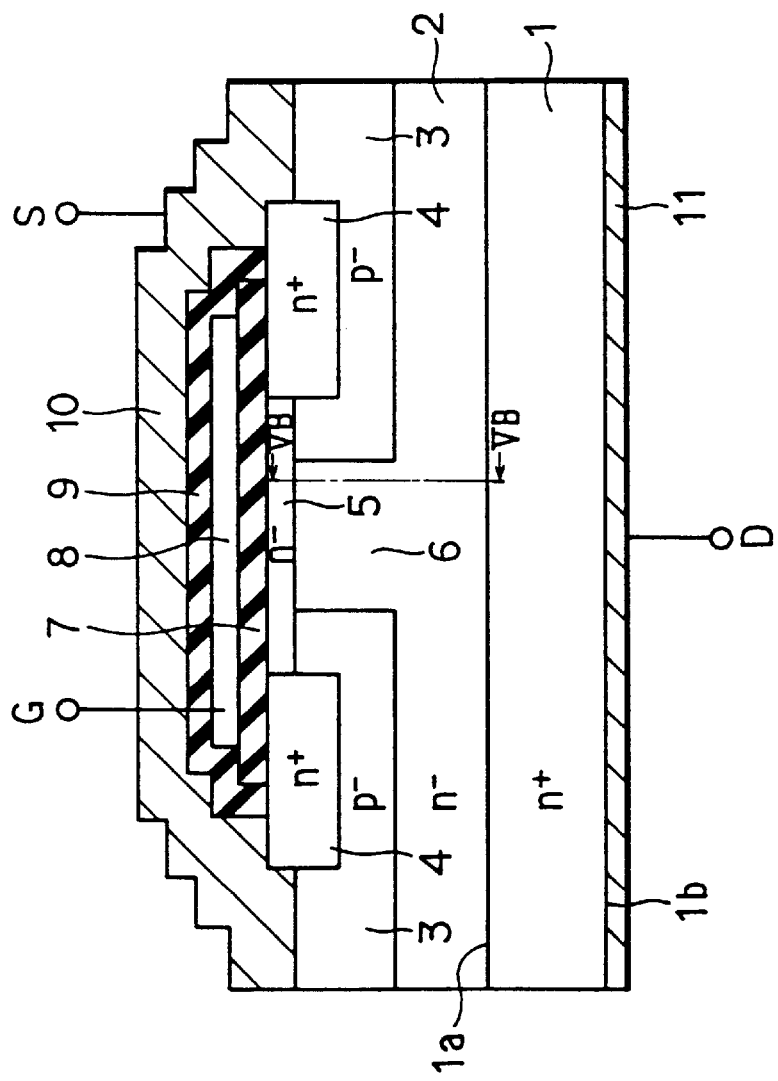
FIG. 5A is a cross-sectional view showing a planar type MOSFET in a second preferred embodiment.

FIG. 5A shows a structure of a vertical power MOSFET according to the second embodiment, and the solid line in FIG. 5B shows a depth concentration profile of the inactive ion species along line VB—VB in FIG. 5A. A depth concentration profile of B in the p type base regions 3 is also indicated in FIG. 5B with a broken line for comparison. As shown in FIG. 5B, the concentration of the inactive ion species implanted into the J-FET portion 6 is larger than that of B implanted into the p type base regions 3. Implanted ions of the inactive ion species are disposed in vacancies in the J-FET portion 6 to eliminate vacancies from the J-FET portion 6.

Because of this, B in the p type base regions 3 is hardly diffused to decrease the J-FET portion 6. The resistance of the J-FET portion 6 is therefore not increased, thereby preventing the ON resistance from increasing, and also preventing the channel length of the channel region, which is formed on the J-FET portion 6, from increasing.

(Third Embodiment)

In the first embodiment, the inactive ion species is implanted into the J-FET portion 6 and the surface channel layer 5. In a third preferred embodiment, the inactive ion species is implanted only into the surface channel layer 5. The other features are the same as those in the first embodiment, and therefore are not reiterated.

FIG. 6A shows a structure of a vertical power MOSFET according to the third embodiment, and a solid line in FIG. 6B shows a depth concentration profile of the inactive ion species along line VIB—VIB in FIG. 6A. A depth concentration profile of B in the p type base regions 3 is also indicated in FIG. 6B with a broken line for comparison. As shown in FIG. 6B, the concentration of the inactive ion species implanted into the surface channel layer 5 is larger than that of B implanted into the p type base regions 3. Implanted ions of the inactive ion species are disposed in vacancies in the surface channel layer 5 to eliminate vacancies from the surface channel layer 5. Because of this, B in the p type base regions 3 is hardly diffused into the surface channel layer 5, and the surface channel layer 5 is prevented from being inverted into a p type layer.

(Fourth Embodiment)

In the first to third embodiments, the inactive ion species is implanted into the region (the J-FET portion 6 and/or the surface channel layer 5) contacting the p type base regions 3. In a fourth preferred embodiment, the inactive ion species is implanted directly into the p type base regions 3.

FIG. 7A shows a structure of a vertical power MOSFET in the present embodiment, and a solid line in FIG. 7B shows a depth concentration profile of the inactive ion species along line VIIB—VIIB in FIG. 7A. A depth concentration profile of B is also indicated in FIG. 7B with a broken line for comparison. As shown in FIG. 7B, the inactive ion species is implanted into the p type base regions 3 to have a concentration larger than that of B. Implanted ions of the inactive ion species are disposed in vacancies, which are produced during the crystal growth of silicon carbide, to eliminate the vacancies from the p type base regions 3 or interact with interstitial Si atoms to form SiC, thereby limiting the B-diffusion.

In this vertical power MOSFET, a diffusion state of B in the p type base regions 3 was examined by a SIMS analysis. Specifically, the diffusion of B was examined by changing the ratio between the concentration of B implanted into the p type base regions 3 and the concentration of the inactive ion species (C) implanted into the p type base regions 3.

Figure 8:
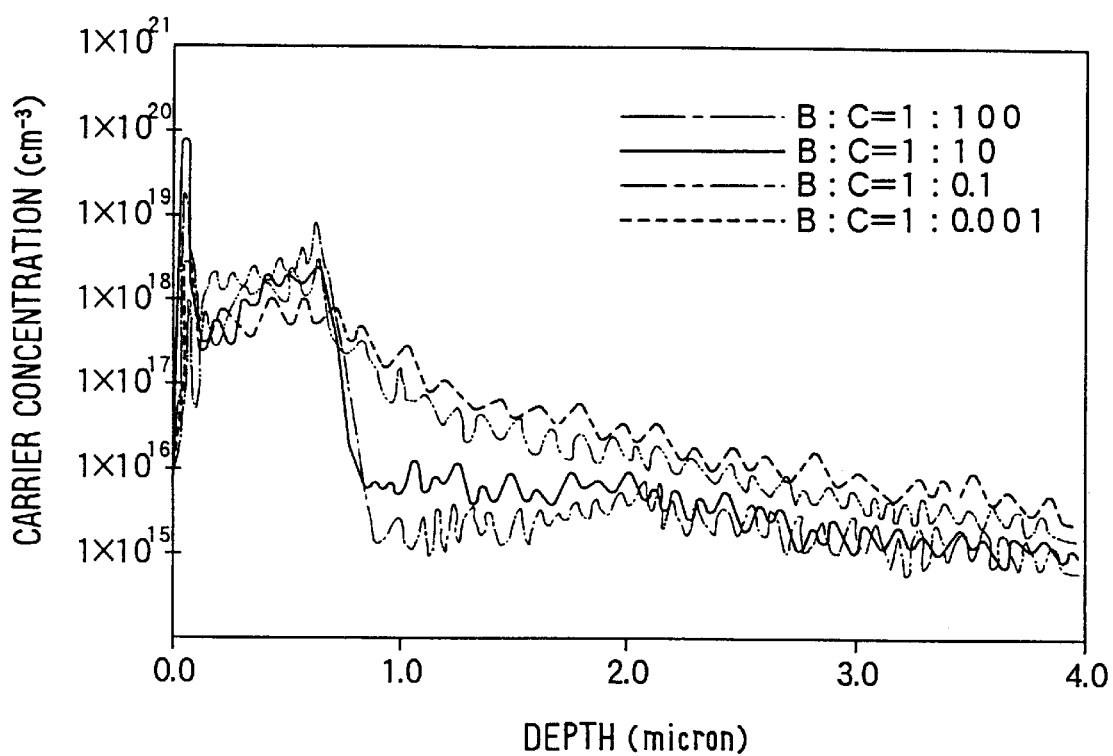
FIG. 8 is a chart showing diffusion of B examined by a SIMS analysis.

As shown in FIG. 8, when the concentration of the inactive ion species is smaller than that of B as when the concentration ratio of B:C is 1:0.1, B is diffused from the implanted region. On the other hand, when the concentration of the inactive ion species is larger than that of B as when the concentration ratio of B:C is 1:10, B is hardly diffused from the implanted region. It is also found that the suppression of the B-diffusion is correlated with the suppression of B-related deep level known as D-center (1999 INTERNATIONAL CONFERENCE ON SOLID STATE DEVICES AND MATERIAL, September, 1999, Tokyo, p.146).

Thus, the implantation of the inactive ion species into the p type base regions 3 can prevent the diffusion of B from the p type base regions 3 into the J-FET portion 6 or the surface channel layer 5 when the heat treatment for activating B or the like is carried out. This is because implanted ions of the inactive ion species eliminate vacancies in the p type base regions 3 or interact with interstitial Si atoms. As a result, the resistance of the J-FET portion 6 is prevented from increasing, thereby preventing an increased ON resistance. Further, the channel length of the channel region that is formed on the J-FET portion 6 is prevented from increasing, and the conductive type of the surface channel layer 5 is thereby prevented from being inverted.

Figure 9A:
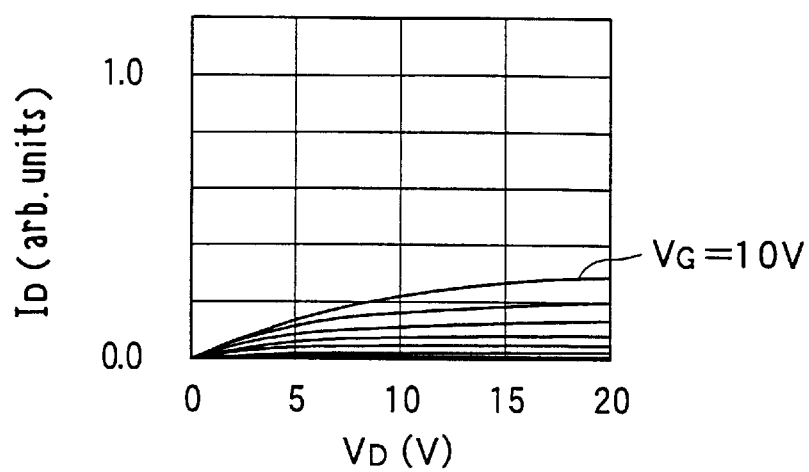
FIGS. 9A to 9C are graphs showing ON characteristics of MOSFETs.
Figure 9B:
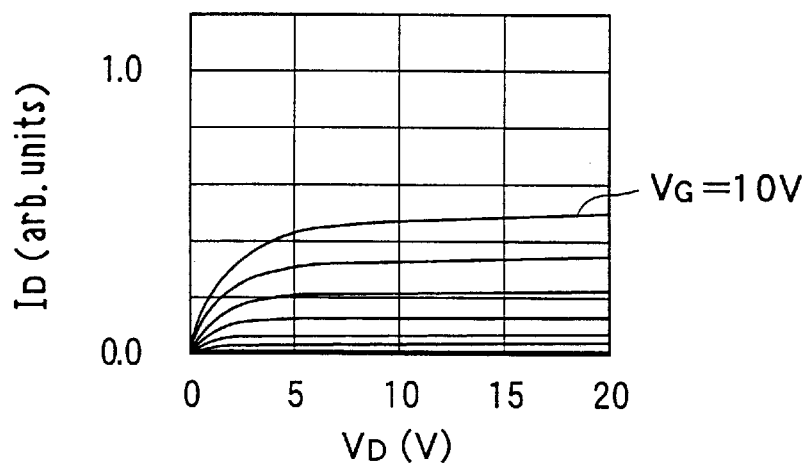
Figure 9C:
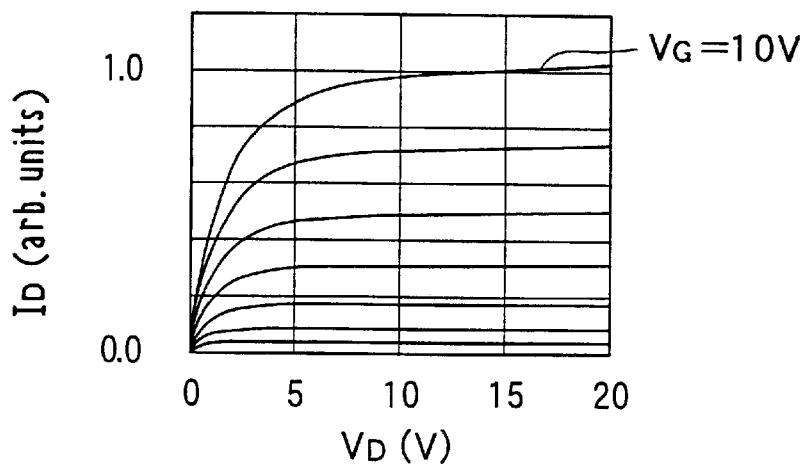

Further, a three-level experiment was carried out on the vertical power MOSFET in which B was implanted alone into the p type base regions 3, and B was implanted into the p type base regions 3 together with the inactive ion species. The experimental results are shown in FIGS. 9A to 9C with ON-characteristics of the MOSFET when the surface channel layer 5 was epitaxially grown at a temperature of 1550° C. FIG. 9A shows the case where B was implanted alone, and FIGS. 9B and 9C show the case where B was implanted together with C (carbon). In FIG. 9B, a ratio of B:C was 1:5, and in FIG, 9C, a ratio of B:C was 1:10. In the experiment, a gap for forming the p type base regions 3 by ion implantation (mask gap) was set at 3 μm.

The experimental results indicate that an amount of current flowing in the case where B was implanted alone was the smallest. This implies that the adjacent p type base regions 3 are connected to each other by diffused B. When C is implanted together with B, the amount of current is increased. This also implies that the implantation of C can prevent the diffusion of B. As a result, even when a small mask gap of, for example, 3fÊm is adopted to form the p type base regions 3, the J-FET resistance is reduced, resulting in improved transistor operation.

(Fifth Embodiment)

Figure 10:
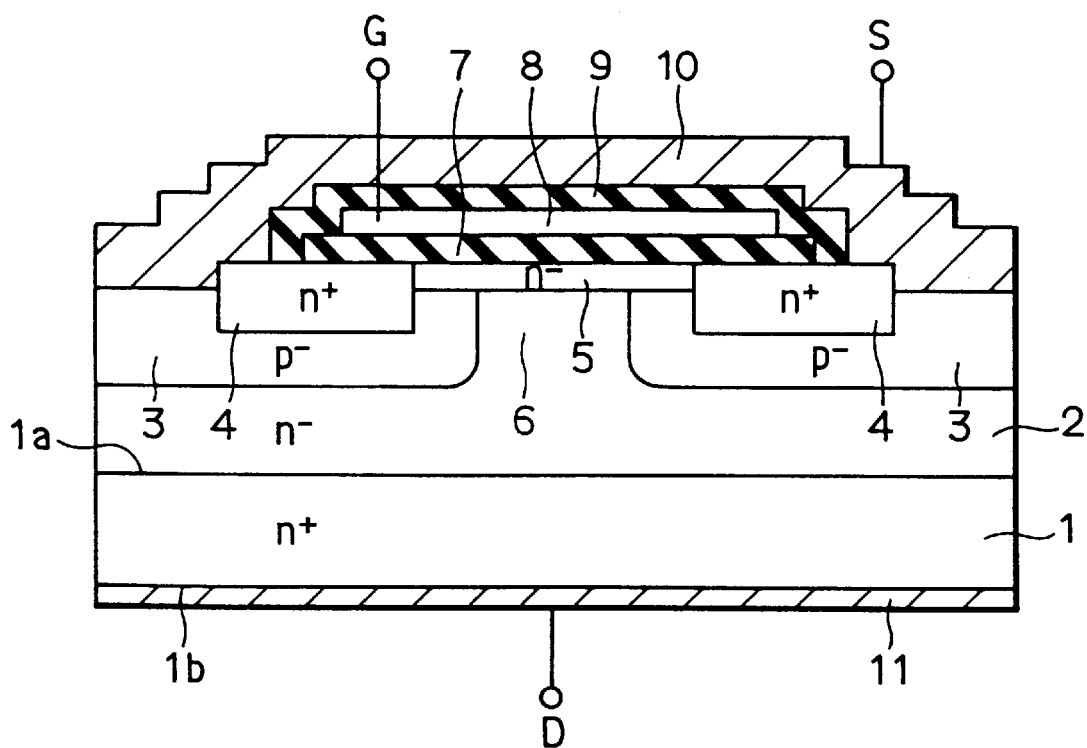
FIG. 10 is a cross-sectional view showing a planar type MOSFET in a fifth preferred embodiment.

A planar type MOSFET in a fifth preferred embodiment is shown in FIG. 10. The MOSFET in the fifth embodiment is manufactured in a manner similar to that in the first embodiment except the following points. Briefly, according to the fifth embodiment, the p type base regions 3 are formed by thermal diffusion, and the diffusion is stopped by the J-FET portion 6. The p type base regions 3 contacting the lower part of the surface channel layer 5 for forming the channel region are formed by the thermal diffusion.

The manufacturing process in the fifth embodiment will be explained in more detail with reference to FIGS. 11 and 12. First, the step shown in FIG. 2A is carried out as in the first embodiment, so that the n⁻ type epi-layer 2 is formed on the n⁺ type semiconductor substrate 1.

Figure 11A:
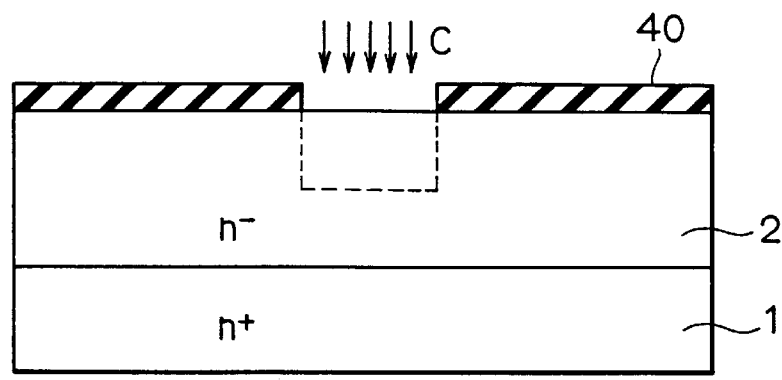
FIGS. 11A to 11C are cross-sectional views for explaining steps for manufacturing the planar type MOSFET shown in FIG. 10.

As shown in FIG. 11A, an LTO film 40 exposing therefrom a specific portion (indicated with broken lines in FIG. 11A) where the J-FET portion 6 is to be provided is disposed on the n⁻ type epi-layer 2, and C (carbon) is ion-implanted as an inactive ion species, using the LTO film 40 as a mask. As the ion implantation conditions, temperature is a range of approximately 500° C. to 1000° C. or more, and a dose is less than approximately $1\times10^{17}$ cm$^{-2}$. Accordingly, carbon ions are disposed in intrinsic carbon vacancies in the portion for the J-FET portion 6 to eliminate the vacancies from the portion.

Figure 11B:
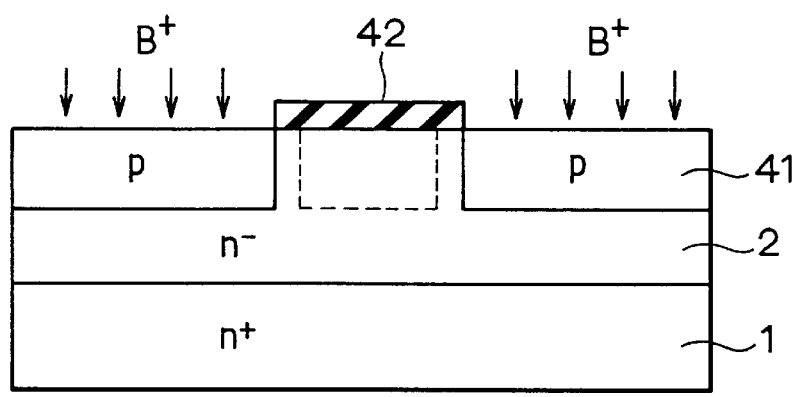

As shown in FIG. 11B, an LTO film 42 is then formed and patterned by photo-lithography to remain at the specific portion on the n⁻ type epi-layer 2. The specific portion includes a portion where the J-FET portion 6 is to be provided and a portion that is to be provided between the n⁺ type source regions 4 and the J-FET portion 6 (a portion where a channel region is to be formed (see FIG. 10)).

After that, ion implantation of B is carried out using the LTO film 42 as a mask. As the ion implantation conditions, a temperature is in a range of approximately 500° C. to 1000° C. or more, and a dose is less than approximately $1\times10^{16}$ cm$^{-2}$. In comparison with C implanted at the step shown in FIG. 11A, a ratio of B:C is approximately 1:10. Accordingly, impurity implantation layers 41 are formed at a specific depth from the surface of the n⁻ type epi-layer 2. Since the specific portion of the n⁻ type epi-layer 2 described above is covered with the LTO film 42, the impurity implantation layers 41 are not provided at the portion where the channel region is to be formed.

Figure 11C:
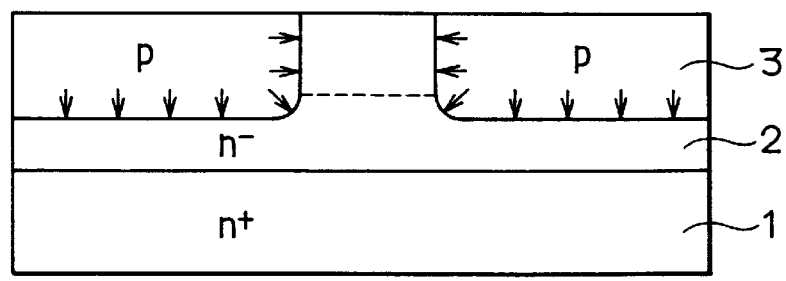

As shown in FIG. 11C, heat treatment is carried out to activate B in the impurity implantation layers 41. At that time, the inactive ion species is implanted into the portion for the J-FET portion 6, but not into the portion between the portion for the J-FET portion 6 and the impurity implantation layers 42. Therefore, B is laterally diffused to the end of the J-FET portion 6. As a result of the thermal diffusion, the p type base regions 3 are formed to underlie the channel region. In silicon carbide, the B-diffusion in a <0001> direction parallel to a c-axis and the B-diffusion in a <11$\bar{2}$0> direction perpendicular to the c-axis have strong anisotropic natures. That is, the B-diffusion in the <11$\bar{2}$0> direction is higher than that in the <0001> direction (1999 INTERNATIONAL CONFERENCE ON SOLID STATE DEVICES, AND MATERIAL, September, 1999, Tokyo).

When the p type base regions 3 are formed under the channel region by directly implanting ions into the portion underlying the channel region, this ion implantation can deteriorate crystallinity of the surface channel layer 5. However, according to the present embodiment, since the portion of the p type base regions 3 underlying the channel region is formed by thermal diffusion, the surface channel layer 5 is formed with high crystallinity. Accordingly, the channel characteristics of the channel region formed in the surface channel layer 5 is improved, resulting in a decreased ON resistance.

Meanwhile, since the inactive ion species is not implanted into the lower portion of the impurity implantation layers 41, the p type base regions 3 are formed at a depth deeper than that of the impurity implantation layers 41 by the diffusion of B. Because of this, the p type base regions 3 work as deep base layers at the deeper depth position, thereby improving device withstand voltage.

In the first, second, fourth and fifth embodiments, the implantation of the inactive ion species is carried out before the implantation of B; however, the inactive ion species may be implanted after the implantation of B. In the second and fifth embodiments, the present invention is applied to prevent B from being diffused into the J-FET portion 6 in the planar accumulation type MOSFET having the surface channel layer 5 as a channel region; however, it can be applied to prevent the diffusion of B into the J-FET portion 6 in a planar inversion type MOSFET.

In the fifth embodiment, the present invention is applied to improve the crystallinity of the surface channel layer 5 as the channel region extending above the p type base regions 3 in the accumulation type MOSFET. However, in an inversion type MOSFET, the present invention can be applied to improve the crystallinity of the surface portions of the p type base regions 3, in which the channel region is to be formed. Also in this case, the channel characteristics are improved, and the ON resistance is reduced.

In the first embodiment, the inactive ion species implanted into the J-FET portion 6 is the same as that implanted into the surface channel layer 5; however, the inactive ion species implanted into the J-FET portion 6 may be different from that implanted into the surface channel layer 5.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a silicon carbide semiconductor device, comprising:

preparing a first conductive type semiconductor substrate made of silicon carbide;

forming a first conductive type semiconductor layer on the semiconductor substrate, the semiconductor layer having a resistance larger than that of the semiconductor substrate;

forming a second conductive type base region in a specific surface portion of the semiconductor layer having a crystal structure to define a J-FET portion contacting the base region;

forming a first conductive type source region in a specific surface portion of the base region at a depth shallower than that of the base region;

forming a gate electrode above the base region between the source region and the J-FET portion through a gate insulation film;

forming a source electrode contacting the base region and the source region; and forming a drain electrode on a drain region of the semiconductor substrate, wherein the base region is formed by:

implanting ions of a first inactive ion species into at least one of the specific surface portion for forming the base region and the J-FET portion, whereby one of the specific surface portion and the J-FET portion has the crystal structure containing the first inactive ion species therein, and implanting second conductive type impurities of an active ion species into the specific surface portion having the crystal structure for forming the base region; and activating the second conductive type impurities to form the base region.

2. The method of claim 1, wherein the second conductive type impurities are boron ions.

3. The method of claim 1, wherein the first inactive ion species is selected from the group consisting of carbon, silicon, argon, helium and neon.

4. The method of claim 1, further comprising:

forming a first conductive type surface channel layer by an epitaxial growth on the base region to connect the source region and the J-FET portion; and implanting ions of a second inactive ion species into the surface channel layer, wherein a conductive impurity concentration of the surface channel layer is determined by the epitaxial growth.

5. The method of claim 4, wherein the second inactive ion species is selected from the group consisting of carbon, silicon, argon, helium and neon.

6. The method of claim 1, wherein the second conductive type impurities are implanted entirely into the specific surface portion for forming the base region.

7. The method of claim 1, wherein:

the second conductive type impurities are implanted into a part of the specific surface portion using a mask covering a surface between the source region and the J-FET portion; and the second conductive type impurities are diffused to exist entirely in the specific surface portion for forming the base region when the second conductive type impurities are activated.

8. The method of claim 1, wherein a concentration of the first inactive ion species is larger than a concentration of the second conductive type impurities.

9. The method of claim 1, wherein the ions of the first inactive ion species are implanted into at least one of the specific surface port ion and the base region before the second conductive type impurities are implanted into the specific surface portion.

10. A method of manufacturing a silicon carbide semiconductor device, comprising:

preparing a first conductive type semiconductor substrate made of silicon carbide;

forming a first conductive type semiconductor layer on the semiconductor substrate, the semiconductor layer having a resistance larger than that of the semiconductor substrate;

forming a second conductive type base region by implanting second conductive type impurities into a specific surface portion of the semiconductor layer;

forming a surface channel layer by an epitaxial growth on the base region;

implanting ions of a first inactive ion species into the surface channel layer whereby the surface channel layer has a crystal structure containing the first inactive ion species therein, wherein an impurity concentration of the surface channel layer is determined by the epitaxial growth;

forming a first conductive type source region in a specific surface portion of the base region at a depth shallower than that of the base region to contact the surface channel layer;

forming a gate electrode above the surface channel layer through a gate insulation film;

forming a source electrode contacting the base region and the source region; and forming a drain electrode on a drain region of the semiconductor substrate.

11. The method of claim 10, wherein the second conductive type impurities are boron ions.

12. The method of claim 10, wherein the first inactive ion species is selected from the group consisting of carbon, silicon, argon, helium and neon.

13. The method of claim 10, wherein the base region is formed by:

forming an impurity implantation layer by implanting the second conductive type impurities and ions of a second inactive ion species into the specific surface portion having a crystal structure; and activating the second conductive type impurities to form the base region and to define a J-FET portion contacting the base region.

14. The method of claim 13, wherein the second inactive ion species is selected from the group consisting of carbon, silicon, argon, helium and neon.

15. The method of claim 10, wherein the first inactive ion species implanted into the surface channel layer has a concentration larger than a concentration of the second conductive type impurities implanted into the base region.

16. A method of manufacturing a silicon carbide semiconductor device, comprising:

preparing a first conductive type semiconductor substrate made of silicon carbide and having a first surface and a second surface;

forming a first conductive type semiconductor layer on the first surface of the semiconductor substrate so that the first conductive type semiconductor layer has a resistance larger than that of the semiconductor substrate;

forming a second conductive type base region in a specific surface portion of the semiconductor layer with a specific depth so that a J-FET portion is formed in a surface portion of the semiconductor layer in contact with the base region;

forming a first conductive type source region in a specific surface portion of the base region with a depth shallower than the specific depth of the base region;

forming a gate electrode above the base region between the J-FET portion and the source region with a gate insulation film interposed therebetween; and forming a source electrode in contact with the base region and the source region, and a drain electrode on the second surface of the semiconductor substrate;

wherein an inactive ion species is included in at least one of the base region and a portion contacting the base region, whereby, the one of the base region and the portion contacting the base region has a crystal structure containing the first inactive ion species therein, wherein the base region is formed by implanting a active ion species into the specific surface portion having the crystal structure.

17. The method of claim 16, wherein the inactive ion species is included in the J-FET portion.

18. The method claim 16, further comprising forming a surface channel layer on the base region to connect the J-FET portion and the base region, wherein:

the inactive ion species is included in the surface channel layer.

19. The method of claim 16, wherein the inactive ion species is selected from the group consisting of carbon, silicon, argon, helium and neon.

20. The method of claim 16, wherein a concentration of the inactive ion species is larger than that of second conductive type impurities included in the base region.

21. The method of claim 1, wherein the ion of the first inactive ion species are implanted at 500° C. or more.

22. The method of claim 10, wherein the ion of the first inactive ion species are implanted at 500° C. or more.

23. The method of claim 16, further comprising:

implanting the inactive ion species at 500° C. or more into at least one of the base region and the portion contacting the base region.

24. The method of claim 1, wherein the ions of the first inactive ion species are implanted into the J-FET portion.

25. The method of claim 10, wherein the ions of the first inactive ion species are implanted into a J-FET portion adjacent to the base region.

26. The method of claim 16, further comprising:

implanting the inactive ion species into the J-FET portion.

27. The method of claim 8, wherein the concentration of the first inactive ion species is ten times or more larger than that of the second conductive type impurities.

28. The method of claim 15, wherein the first inactive ion species has a concentration at least ten times larger than that of the second conductive type impurities.

29. The method of claim 16, wherein a concentration of the first inactive ion species is at least ten times larger than that of conductive impurities of the base region.

30. The method of claim 1, wherein the ions of the first inactive ion species occupy vacancies in the one of the specific surface portion and the J-FET portion.

31. The method of claim 10, wherein the ions of the first inactive ion species occupy vacancies in the surface channel layer.

32. The method of claim 16, wherein the ions of the first inactive ion species occupy vacancies in the one of the base region and the portion contacting the base region.

* * * * *